(12) United States Patent
Liao

(10) Patent No.: US 11,183,537 B2
(45) Date of Patent: Nov. 23, 2021

(54) LIGHT-EMITTING MODULE

(71) Applicant: ASTI GLOBAL INC., Taichung (TW)

(72) Inventor: Chien-Shou Liao, New Taipei (TW)

(73) Assignee: ASTI GLOBAL INC., TAIWAN, Taichung (TW)

( * ) Notice: Subject to any disclaimer, the term of this patent is extended or adjusted under 35 U.S.C. 154(b) by 2 days.

(21) Appl. No.: 16/983,125

(22) Filed: Aug. 3, 2020

(65) Prior Publication Data

US 2021/0118945 A1 Apr. 22, 2021

(30) Foreign Application Priority Data

Oct. 21, 2019 (TW) .................................. 108137900

(51) Int. Cl.
*H01L 27/15* (2006.01)
*H01L 33/48* (2010.01)
*H01L 33/62* (2010.01)

(52) U.S. Cl.
CPC .......... *H01L 27/156* (2013.01); *H01L 33/486* (2013.01); *H01L 33/62* (2013.01)

(58) Field of Classification Search
CPC ..... H01L 27/156; H01L 33/486; H01L 33/62; H01L 25/0753; H01L 25/167
See application file for complete search history.

(56) References Cited

U.S. PATENT DOCUMENTS

| | | | | |
|---|---|---|---|---|
| 8,436,372 B2* | 5/2013 | Fujikawa | ............. | G09G 3/3266 257/88 |
| 10,199,362 B1* | 2/2019 | Wu | ....................... | H01L 25/167 |
| 2005/0057939 A1* | 3/2005 | Mizuyoshi | .......... | H01L 25/0753 362/505 |
| 2007/0001711 A1* | 1/2007 | Kwak | ..................... | G09G 3/006 324/762.07 |
| 2018/0197471 A1* | 7/2018 | Rotzoll | .................. | H01L 25/167 |
| 2018/0323180 A1* | 11/2018 | Cok | ....................... | H01L 25/042 |
| 2019/0049771 A1* | 2/2019 | Ye | ........................... | H01L 27/12 |
| 2019/0325803 A1* | 10/2019 | Chen | ..................... | G06F 3/0412 |
| 2019/0333901 A1* | 10/2019 | Cok | ..................... | H01L 21/6835 |
| 2019/0393389 A1* | 12/2019 | Chen | ...................... | H01L 25/13 |
| 2020/0091391 A1* | 3/2020 | Jung | .................. | H01L 25/0753 |
| 2020/0161403 A1* | 5/2020 | Jung | ................... | H01L 27/3276 |
| 2020/0227391 A1* | 7/2020 | Li | ........................ | H01L 27/1214 |

\* cited by examiner

*Primary Examiner* — Victor A Mandala
(74) *Attorney, Agent, or Firm* — JCIPRNET

(57) ABSTRACT

A light-emitting module includes a substrate, a plurality of light-emitting assembles and a signal controller. The substrate includes a plurality of control circuits. Each light-emitting assembly includes a plurality of LED structures disposed on the substrate, and the LED structures are respectively electrically connected to the control circuits. The signal controller is disposed on the substrate. The LED structures are arranged as a pixel matrix. The substrate includes a plurality of signal pads that are respectively electrically connected to the light-emitting assembles, and that are electrically connected to the signal controller. The substrate has two first lateral regions opposite to each other and two second lateral regions opposite to each other, and the signal pads are disposed on the first lateral region and not disposed on the two second lateral regions, or disposed on the second lateral regions and not disposed on the two first lateral regions.

10 Claims, 5 Drawing Sheets

LIGHT-EMITTING MODULE

CROSS-REFERENCE TO RELATED PATENT APPLICATION

This application claims the benefit of priority to Taiwan Patent Application No. 108137900, filed on Oct. 21, 2019. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a light-emitting technology, and more particularly to a light-emitting module.

BACKGROUND OF THE DISCLOSURE

A light emitting diode (LED) is now widely used because of its excellent light quality and high luminous efficiency. Generally, in order to enhance color performance of a display device using LEDs as light emitters, a combination of red, green, and blue LED chips is used to form a full-color LED display device in the related art. The full-color LED display device can emit red, green and blue colors respectively through the red, green and blue LED chips, and then form a full-color light by mixing lights to display related information.

SUMMARY OF THE DISCLOSURE

In response to the above-referenced technical inadequacies, the present disclosure provides a light-emitting module.

In one aspect, the present disclosure provides a light-emitting module, including a substrate, a plurality of light-emitting assembles and a signal controller. The substrate includes a main body and a plurality of grounding circuits disposed inside the main body. A plurality of control circuits are disposed in or on the main body, each control circuit has a conductive pad exposed from the main body, and each grounding circuit has a grounding pad exposed from the main body. Each light-emitting assembly includes a plurality of LED structures disposed on the substrate. Each LED structure has a first electrode side electrically connected to the corresponding conductive pad and a second electrode side electrically connected to the corresponding grounding pad. The signal controller is disposed on the main body of the substrate. The light-emitting assemblies are adjacent to each other such that the LED structures of the light-emitting assembles are arranged as a pixel matrix. The substrate includes a plurality of signal pads that are respectively electrically connected to the light-emitting assembles, and that are electrically connected to the signal controller. The substrate has two first lateral regions opposite to each other and two second lateral regions opposite to each other, the signal pads are disposed on the first lateral region and not disposed on the two second lateral regions, or the signal pads are disposed on the second lateral regions and not disposed on the two first lateral regions.

In another aspect, the present disclosure provides a light-emitting module, including a substrate, a plurality of light-emitting assembles and a signal controller. The substrate includes a plurality of control circuits. Each light-emitting assembly includes a plurality of LED structures disposed on the substrate, and the LED structures are respectively electrically connected to the control circuits. The signal controller is disposed on the substrate. The light-emitting assemblies are adjacent to each other such that the LED structures of the light-emitting assembles are arranged as a pixel matrix. The substrate includes a plurality of signal pads that are respectively electrically connected to the light-emitting assembles, and that are electrically connected to the signal controller. The substrate has two first lateral regions opposite to each other and two second lateral regions opposite to each other, the signal pads are disposed on the first lateral region and not disposed on the two second lateral regions, or the signal pads are disposed on the second lateral regions and not disposed on the two first lateral regions.

Therefore, the light-emitting module can provide an increased light-emitting efficiency and a wider spread of light by virtue of "the substrate including a plurality of control circuits", "each light-emitting assembly including a plurality of LED structures disposed on the substrate, and the LED structures being respectively electrically connected to the control circuits", "the signal controller being disposed on the substrate", "the light-emitting assemblies being adjacent to each other such that the LED structures of the light-emitting assembles are arranged as a pixel matrix", "the substrate including a plurality of signal pads that are respectively electrically connected to the light-emitting assembles, and that are electrically connected to the signal controller", and "the substrate having two first lateral regions opposite to each other and two second lateral regions opposite to each other, the signal pads being disposed on the first lateral region and not disposed on the two second lateral regions, or the signal pads being disposed on the second lateral regions and not disposed on the two first lateral regions".

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
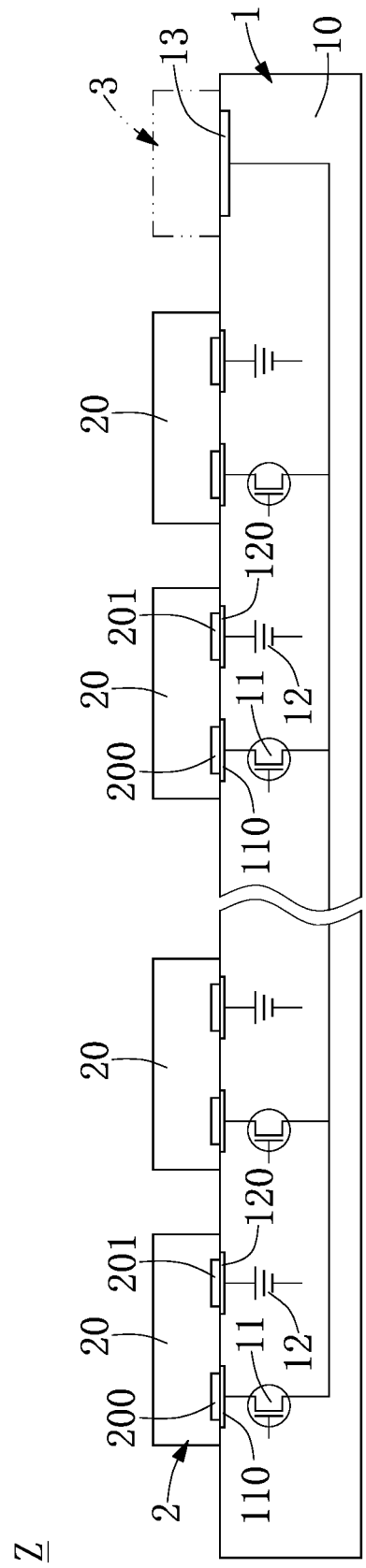
FIG. 1 is a lateral, schematic view of a light-emitting module according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 2:
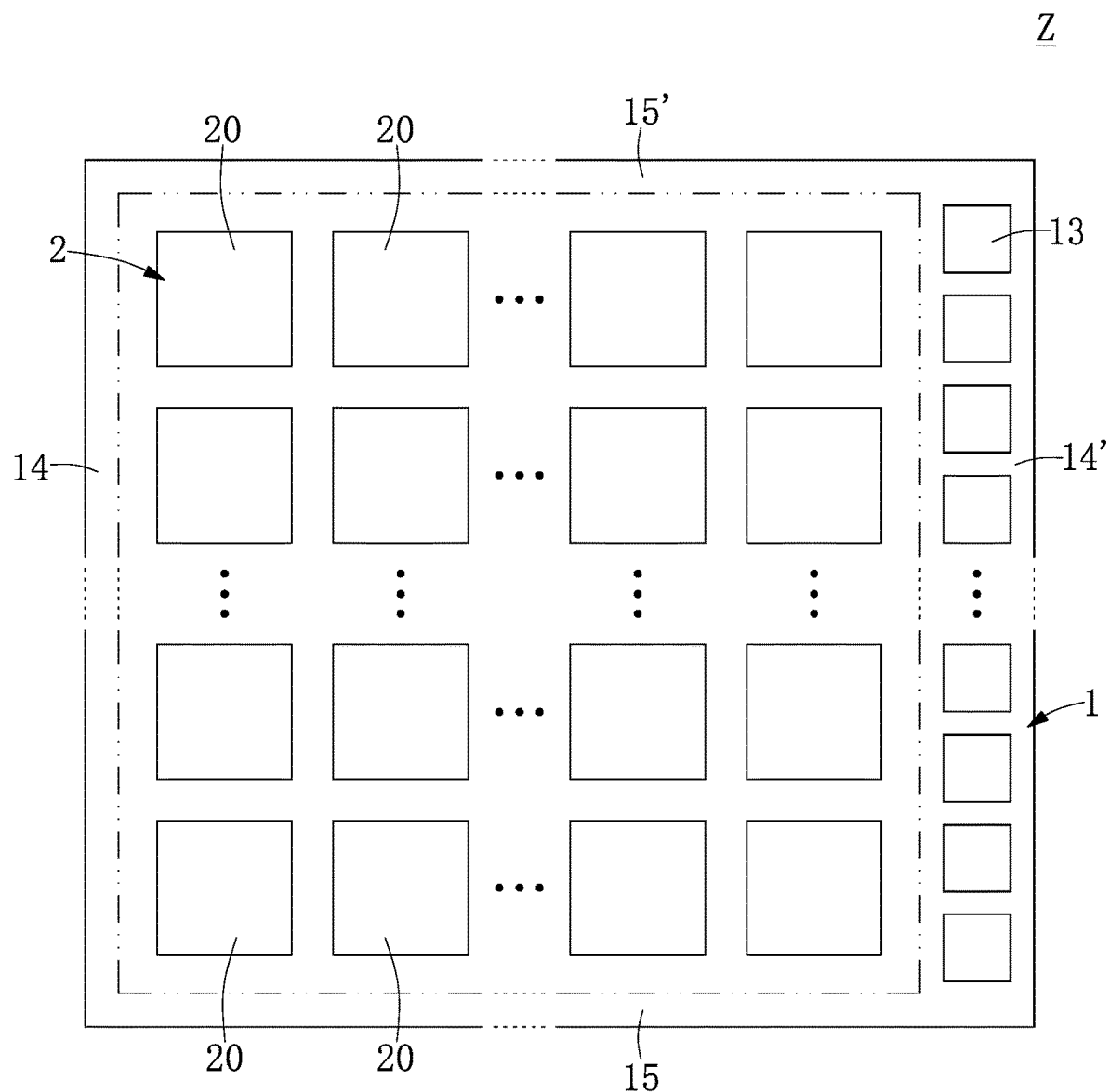
FIG. 2 is a top, schematic view of the light-emitting module according to the first embodiment of the present disclosure.
Figure 3:
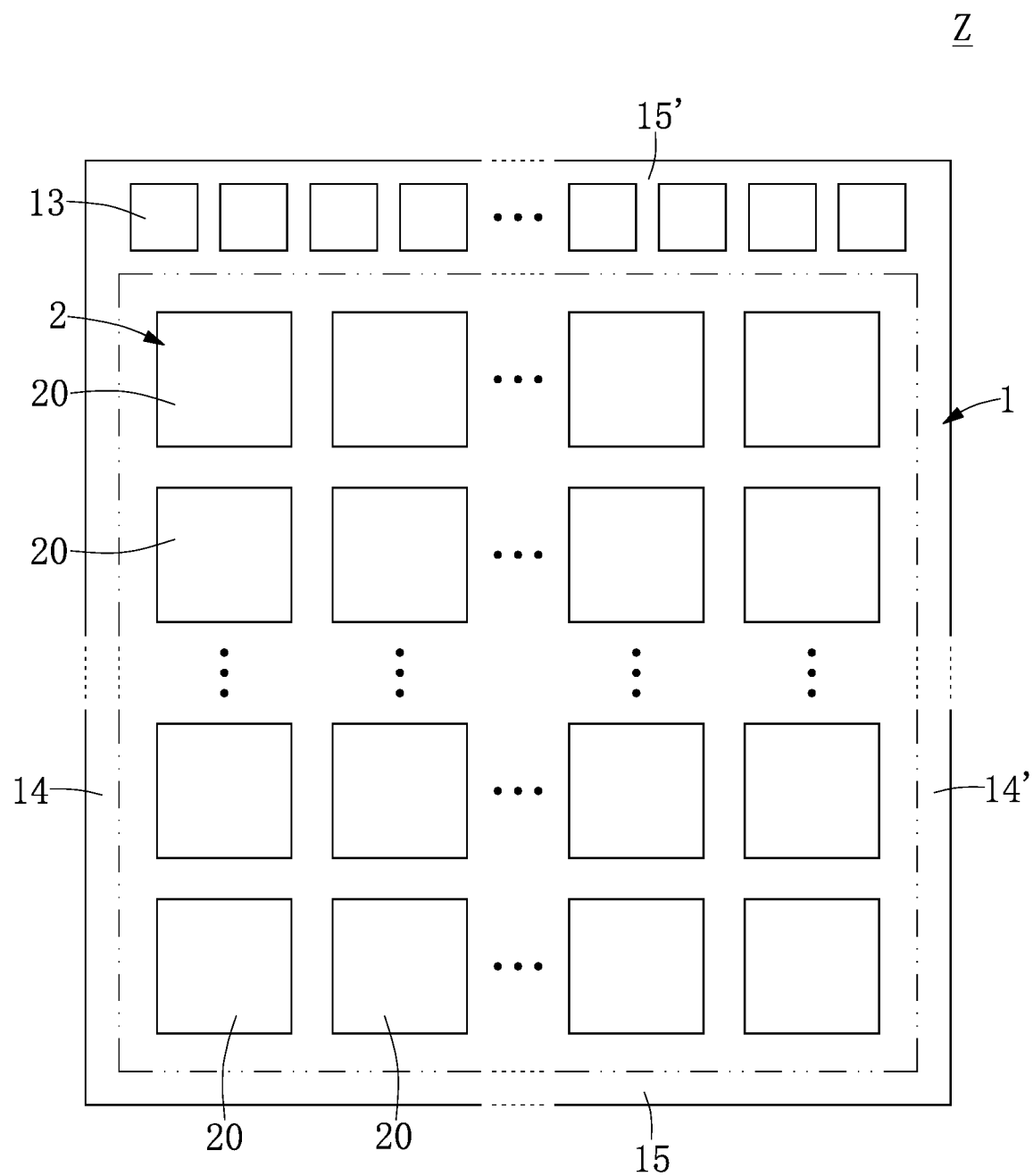
FIG. 3 is another top, schematic view of the light-emitting module according to the first embodiment of the present disclosure.

Referring to FIG. 1 to FIG. 3, the first embodiment of the present disclosure provides a light-emitting module Z, including a substrate 1, a plurality of light-emitting assembles 2 and a signal controller 3.

Firstly, referring to FIG. 1, the substrate 1 includes a main body 10 and a plurality of grounding circuits 12, and a plurality of control circuits 11 and the grounding circuits 12 are disposed (or built-in) inside the main body 10. For another example, the control circuits 11 can be disposed on the main body 10. That is to say, the layout of the control circuits 11 can be formed on the main body 10 in advance, and then the light-emitting assembles 2 are arranged on the main body 10 after the control circuits 11 are formed. Moreover, each control circuit 11 has a conductive pad 110 exposed from the main body 10, and each grounding circuit 12 has a grounding pad 120 exposed from the main body 10. For example, the substrate 1 may be a silicon wafer, epitaxial silicon wafer, argon anneal silicon wafer, Hai silicon wafer, or silicon on insulator silicon wafer, and the control circuit 11 may be a complementary metal-oxide-semiconductor (CMOS) control circuit, which has a source, a drain and a gate, but the present disclosure is not limited thereto.

Next, referring to FIG. 1, each light-emitting assembly 2 includes a plurality of LED structures 20 disposed on the substrate 1, and each LED structure 20 has a first electrode side 200 electrically connected to the corresponding conductive pad 110 and a second electrode side 201 electrically connected to the corresponding grounding pad 120. For example, the LED structure 20 may be a red LED, a green LED or a blue LED, but it is merely an example and is not meant to limit the scope of the present disclosure. More particularly, the light-emitting assemblies 2 are adjacent to each other such that the LED structures 20 of the light-emitting assembles 2 are arranged as a pixel matrix (or a pixel array).

Moreover, referring to FIG. 1, the substrate 1 includes a plurality of signal pads 13 that are respectively electrically connected to the LED structures 20 of the light-emitting assembles 2, and that are electrically connected to the signal controller 3 that is disposed on the main body 10 of the substrate 1. For example, the signal controller 3 may be a microcontroller unit (MCU), but it is merely an example and is not meant to limit the scope of the present disclosure.

More particularly, referring to FIG. 1 to FIG. 3, the substrate 1 has two first lateral regions (14, 14') opposite to each other and two second lateral regions (15, 15') opposite to each other. In addition, the signal pads 13 are disposed on the first lateral region 14' and not disposed on the two second lateral regions (15, 15') as shown in FIG. 2, or the signal pads 13 are disposed on the second lateral regions 15' and not disposed on the two first lateral regions (14, 14') as shown in FIG. 3.

For example, referring to FIG. 1 and FIG. 2, the width of the first lateral region 14' is larger than the width of each signal pad 13, and both the width of the first lateral region 14 and the width of the second lateral region (15 or 15') are smaller than the width of each signal pad 13, so that the signal pads 13 can be arranged on the first lateral region 14' and not be arranged on the two second lateral regions (15, 15').

For example, referring to FIG. 1 and FIG. 3, the width of the second lateral region 15' is larger than the width of each signal pad 13, and both the width of the second lateral region 15 and the width of the first lateral region (14 or 14') are smaller than the width of each signal pad 13, so that the signal pads 13 can be arranged on the second lateral region 15' and not be arranged on the two first lateral regions (14, 14').

It should be noted that the aforementioned description of the first embodiment is merely an example and is not meant to limit the scope of the present disclosure.

Second Embodiment

Figure 4:
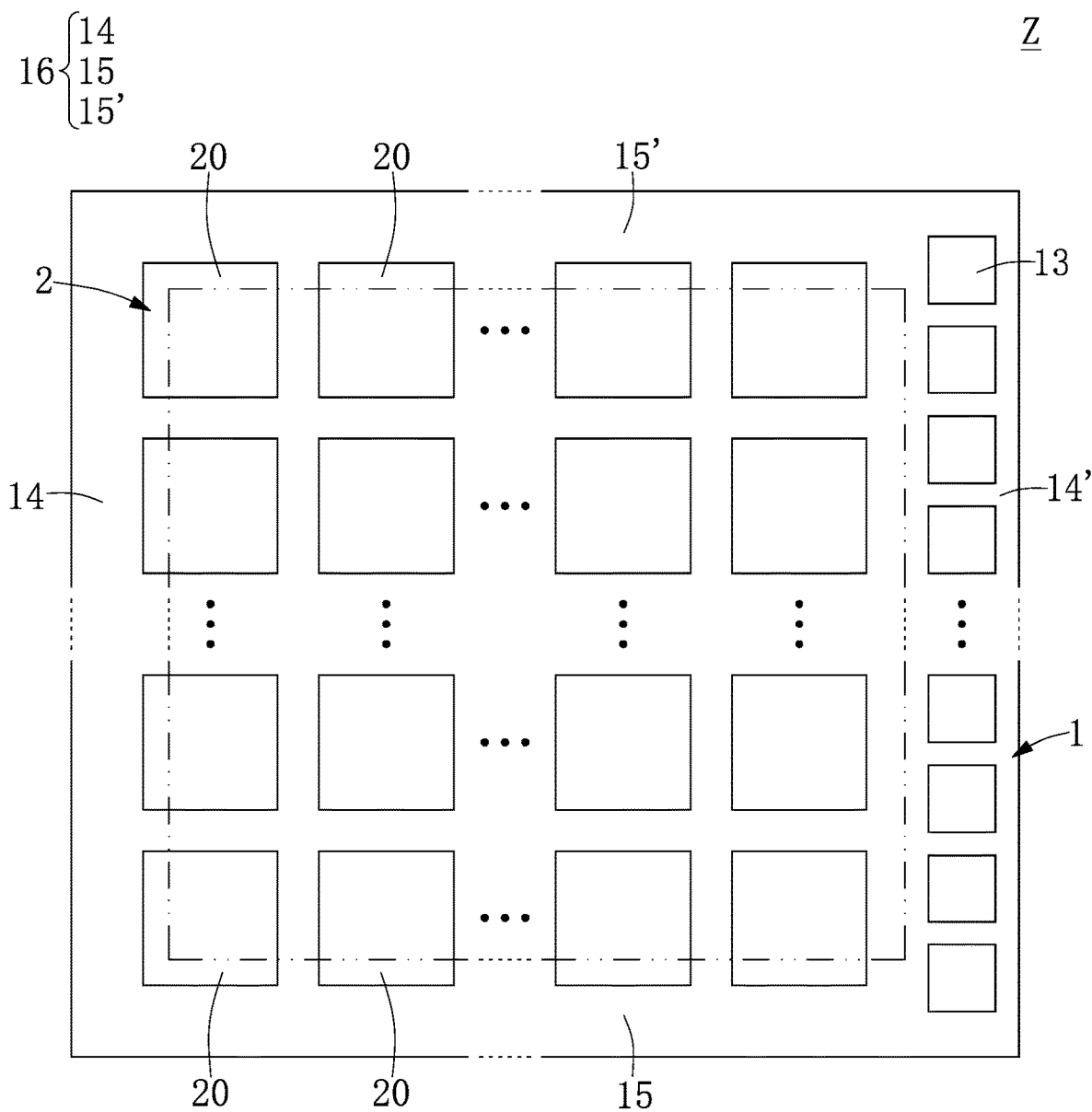
FIG. 4 is a top, schematic view of the light-emitting module according to a second embodiment of the present disclosure.

Referring to FIG. 4, the second embodiment of the present disclosure provides a light-emitting module Z, including a substrate 1, a plurality of light-emitting assembles 2 and a signal controller 3. Comparing FIG. 4 with FIG. 2, the difference between the second embodiment and the first embodiment is as follows: in the second embodiment, the signal pads 13 are disposed on one of the two first lateral regions (14, 14'), and another one of the two first lateral regions (14, 14') and the two second lateral regions (15, 15') cooperatively form a non-pad region 16 (such as a clearance area) without the signal pads 13, and a number of the plurality of LED structures 20 are each partially disposed on the non-pad region 16.

For example, referring to FIG. 4, the signal pads 13 are disposed on the first lateral region 14', and another one of the two first lateral regions 14 is connected with the two second lateral regions (15, 15') to form a non-pad region 16 that has none of the signal pads 13 disposed thereon. In addition, the width of the first lateral region (14 or 14') and the width of the second lateral region (15 or 15') are substantially the same, but it is merely an example and is not meant to limit the scope of the present disclosure. More particularly, a number of the plurality of LED structures 20 are each partially disposed on at least one of the first lateral region 14 and the two second lateral regions (15, 15').

More particularly, one of the two first lateral regions (14, 14') has none of the LED structures 20 disposed thereon, and another one of the two first lateral regions (14, 14') has none of the signal pads 13 disposed thereon. For example, the signal pads 13 can be disposed on the first lateral region 14' without the LED structures 20, a part of the LED structures 20 can be disposed on the first lateral region 14 without the signal pads 13, and another part of the LED structures 20 can be disposed on the second lateral regions (15, 15') without the signal pads 13.

It should be noted that the aforementioned description of the second embodiment is merely an example and is not meant to limit the scope of the present disclosure.

Third Embodiment

Figure 5:
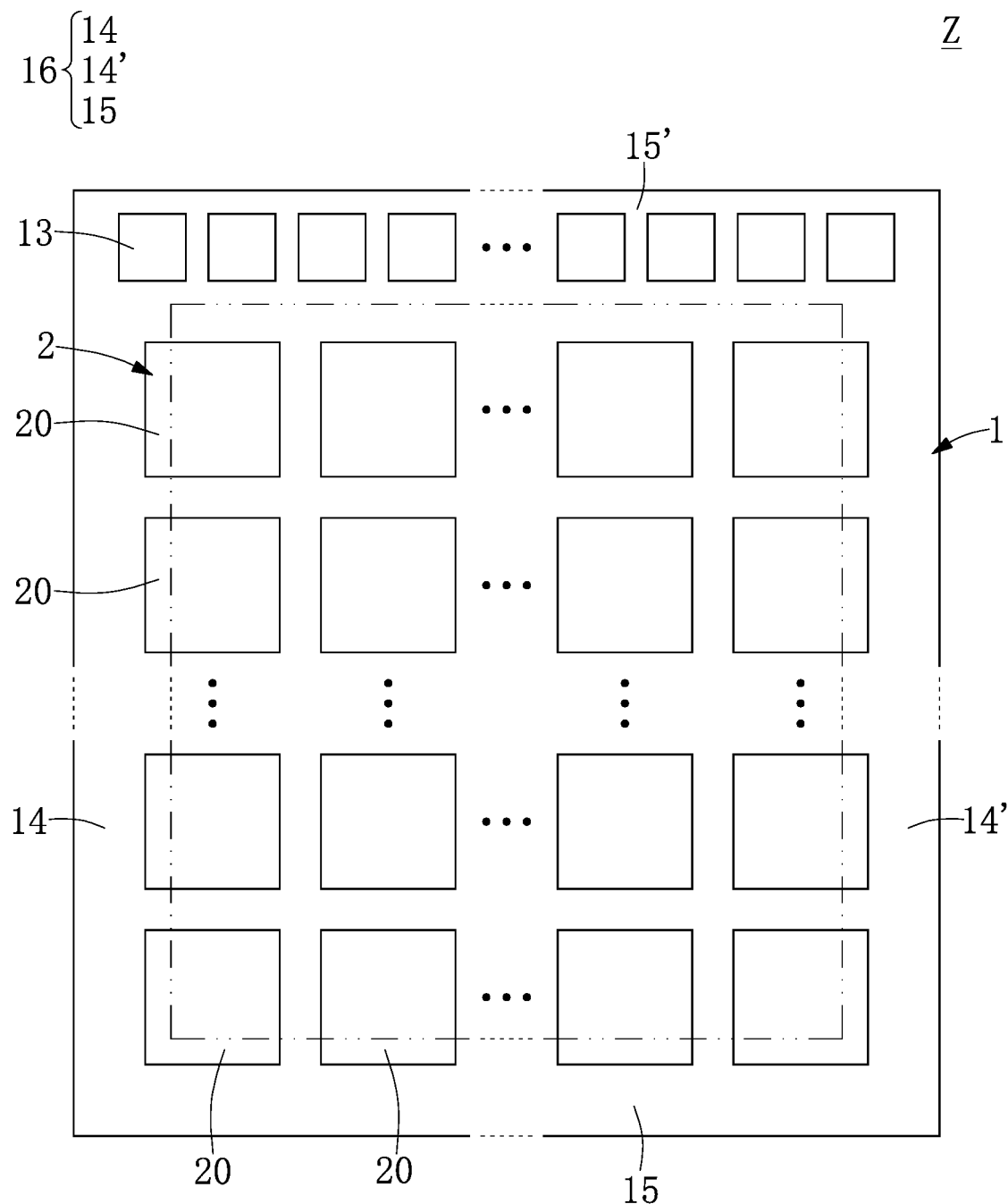
FIG. 5 is a top, schematic view of the light-emitting module according to a third embodiment of the present disclosure.

Referring to FIG. 5, the third embodiment of the present disclosure provides a light-emitting module Z, including a substrate 1, a plurality of light-emitting assembles 2 and a signal controller 3. Comparing FIG. 5 with FIG. 3, the difference between the third embodiment and the first embodiment is as follows: in the third embodiment, the signal pads 13 are disposed on one of the two second lateral regions (15, 15'), and another one of the two second lateral regions 15 is connected with the two first lateral regions (14, 14') to form a non-pad region 16 (such as a clearance area) without the signal pads 13, and a number of the plurality of LED structures 20 are each partially disposed on the non-pad region 16.

For example, referring to FIG. 5, the signal pads 13 are disposed on the second lateral region 15', and the second lateral region 15 and the two first lateral regions (14, 14') are connected with each other to form a non-pad region 16 that has none of the signal pads 13 disposed thereon. In addition, the width of the first lateral region (14 or 14') and the width of the second lateral region (15 or 15') are substantially the same, but it is merely an example and is not meant to limit the scope of the present disclosure. More particularly, a number of the plurality of LED structures 20 are each partially disposed on at least one of the second lateral region 15 and the two first lateral regions (14, 14').

More particularly, one of the two second lateral regions (15, 15') has none of the LED structures 20 disposed thereon, and another one of the two second lateral regions (15, 15') has none of the signal pads 13 disposed thereon. For example, the signal pads 13 are disposed on the second lateral region 15' without the LED structures 20, a part of the LED structures 20 are disposed on the second lateral region 15 without the signal pads 13, and another part of the LED structures 20 are disposed on the first lateral regions (14, 14') without the signal pads 13.

It should be noted that the aforementioned description of the third embodiment is merely an example and is not meant to limit the scope of the present disclosure.

In conclusion, the light-emitting module Z can provide an increased light-emitting efficiency and a wider spread of light by virtue of "the substrate 1 including a plurality of control circuits 11", "each light-emitting assembly 2 including a plurality of LED structures 20 disposed on the substrate 1, and the LED structures 20 being respectively electrically connected to the control circuits 11", "the signal controller 3 being disposed on the substrate 1", "the light-emitting assemblies 2 being adjacent to each other such that the LED structures 20 of the light-emitting assembles 2 being arranged as a pixel matrix", "the substrate 1 including a plurality of signal pads 13 that are respectively electrically connected to the light-emitting assembles 2, and that are electrically connected to the signal controller 3", and "the substrate 1 having two first lateral regions (14, 14') opposite to each other and two second lateral regions (15, 15') opposite to each other, the signal pads 13 being disposed on the first lateral region 14' and not disposed on the two second lateral regions (15, 15'), or the signal pads 13 being disposed on the second lateral regions 15' and not disposed on the two first lateral regions (14, 14')".

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A light-emitting module, comprising:
a substrate including a main body and a plurality of grounding circuits disposed inside the main body, wherein a plurality of control circuits are disposed in or on the main body, each of the control circuits has a conductive pad exposed from the main body, and each of the grounding circuits has a grounding pad exposed from the main body;
a plurality of light-emitting assembles each including a plurality of LED structures disposed on the substrate, wherein each of the LED structures has a first electrode side electrically connected to the corresponding conductive pad and a second electrode side electrically connected to the corresponding grounding pad; and
a signal controller disposed on the main body of the substrate;
wherein the light-emitting assemblies are adjacent to each other such that the LED structures of the light-emitting assembles are arranged as a pixel matrix;
wherein the substrate includes a plurality of signal pads that are respectively electrically connected to the light-emitting assembles, and that are electrically connected to the signal controller;
wherein the substrate has two first lateral regions opposite to each other and two second lateral regions opposite to each other, and the signal pads are disposed on the first lateral region and not disposed on the two second lateral regions, or disposed on the second lateral regions and not disposed on the two first lateral regions.

2. The light-emitting module according to claim 1, wherein the signal pads are disposed on one of the two first lateral regions, and another one of the two first lateral regions is connected with the two second lateral regions to form a non-pad region without the signal pads, and a number of the plurality of LED structures are each partially disposed on the non-pad region.

3. The light-emitting module according to claim 1, wherein the signal pads are disposed on one of the two second lateral regions, and another one of the two second lateral regions is connected with the two first lateral regions to form a non-pad region without the signal pads, and a number of the plurality of LED structures are each partially disposed on the non-pad region.

4. The light-emitting module according to claim 1, wherein one of the two first lateral regions has none of the LED structures disposed thereon, and another one of the two first lateral regions has none of the signal pads disposed thereon, wherein the signal pads are disposed on the first lateral region without the LED structures, a part of the LED structures are disposed on the first lateral region without the signal pads, and another part of the LED structures are disposed on the second lateral regions without the signal pads.

5. The light-emitting module according to claim 1, wherein one of the two second lateral regions has none of the LED structures disposed thereon, and another one of the two second lateral regions has none of the signal pads disposed thereon, wherein the signal pads are disposed on the second lateral region without the LED structures, a part of the LED structures are disposed on the second lateral region without the signal pads, and another part of the LED structures are disposed on the first lateral regions without the signal pads.

6. A light-emitting module, comprising:
a substrate including a plurality of control circuits;
a plurality of light-emitting assembles each including a plurality of LED structures disposed on the substrate, wherein the LED structures are respectively electrically connected to the control circuits; and
a signal controller disposed on the substrate;
wherein the light-emitting assembles are adjacent to each other such that the LED structures of the light-emitting assembles are arranged as a pixel matrix;
wherein the substrate includes a plurality of signal pads that are respectively electrically connected to the light-emitting assembles, and that are electrically connected to the signal controller;
wherein the substrate has two first lateral regions opposite to each other and two second lateral regions opposite to each other, the signal pads are disposed on the first lateral region and not disposed on the two second lateral regions, or the signal pads are disposed on the second lateral regions and not disposed on the two first lateral regions.

7. The light-emitting module according to claim 6, wherein the signal pads are disposed on one of the two first lateral regions, and another one of the two first lateral regions is connected with the two second lateral regions to form a non-pad region without the signal pads, and a number of the plurality of LED structures are each partially disposed on the non-pad region.

8. The light-emitting module according to claim 6, wherein the signal pads are disposed on one of the two second lateral regions, and another one of the two second lateral regions is connected with the two first lateral regions to form a non-pad region without the signal pads, and a number of the plurality of LED structures are each partially disposed on the non-pad region.

9. The light-emitting module according to claim 6, wherein one of the two first lateral regions has none of the LED structures disposed thereon, and another one of the two first lateral regions has none of the signal pads disposed thereon, wherein the signal pads are disposed on the first lateral region without the LED structures, a part of the LED structures are disposed on the first lateral region without the signal pads, and another part of the LED structures are disposed on the second lateral regions without the signal pads.

10. The light-emitting module according to claim 6, wherein one of the two second lateral regions has none of the LED structures disposed thereon, and another one of the two second lateral regions has none of the signal pads disposed thereon, wherein the signal pads are disposed on the second lateral region without the LED structures, a part of the LED structures are disposed on the second lateral region without the signal pads, and another part of the LED structures are disposed on the first lateral regions without the signal pads.

\* \* \* \* \*